(12) United States Patent
Kim et al.

(10) Patent No.: US 9,651,816 B2
(45) Date of Patent: May 16, 2017

(54) DISPLAY PANEL, DISPLAY APPARATUS HAVING THE SAME AND METHOD FOR DISPLAYING IMAGE USING THE SAME

(71) Applicant: Samsung Display Co., Ltd., Yongin, Gyeonggi-Do (KR)

(72) Inventors: Do-Youb Kim, Suwon-si (KR); An-Su Lee, Seoul (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 196 days.

(21) Appl. No.: 14/318,197

(22) Filed: Jun. 27, 2014

(65) Prior Publication Data

US 2015/0009436 A1    Jan. 8, 2015

(30) Foreign Application Priority Data

Jul. 3, 2013   (KR) ........................ 10-2013-0077921

(51) Int. Cl.

| | | |
|---|---|---|
| *G02F 1/1334* | (2006.01) | |
| *G02F 1/135* | (2006.01) | |
| *G02F 1/1347* | (2006.01) | |
| *G02F 1/137* | (2006.01) | |
| *H01L 27/32* | (2006.01) | |
| *H01L 51/52* | (2006.01) | |

(52) U.S. Cl.
CPC ........ *G02F 1/1334* (2013.01); *G02F 1/13476* (2013.01); *G02F 1/13725* (2013.01); *H01L 27/3232* (2013.01); *G02F 2201/44* (2013.01); *H01L 51/5237* (2013.01)

(58) Field of Classification Search
None
See application file for complete search history.

(56) References Cited

U.S. PATENT DOCUMENTS

| | | | | |
|---|---|---|---|---|
| 6,028,649 | A * | 2/2000 | Faris | G02B 27/0093 348/E13.004 |
| 2005/0179827 | A1* | 8/2005 | Scharenbroch | B60K 35/00 349/16 |
| 2007/0018943 | A1* | 1/2007 | Bayrle | G02F 1/133555 345/102 |
| 2008/0239198 | A1* | 10/2008 | Kim | G02F 1/1334 349/62 |
| 2011/0249211 | A1* | 10/2011 | Song | G02F 1/1334 349/42 |
| 2012/0032175 | A1* | 2/2012 | Wang | H01L 27/3232 257/59 |

(Continued)

FOREIGN PATENT DOCUMENTS

| | | |
|---|---|---|
| KR | 1020050069535 A | 7/2005 |
| KR | 1020090109927 A | 10/2009 |
| KR | 2020110010712 | 11/2011 |

*Primary Examiner* — Ryan Crockett
(74) *Attorney, Agent, or Firm* — Robert E. Bushnell, Esq.

(57) ABSTRACT

A display panel includes a first substrate, a first transparent electrode disposed on the first substrate, and to which a first voltage is applied in a display mode which an image is displayed, a polymer dispersed liquid crystal layer disposed on the first transparent electrode having photosensitive polymer molecules and liquid crystal molecules, and a second transparent electrode disposed on the polymer dispersed liquid crystal layer and to which a second voltage is applied in the display mode.

18 Claims, 3 Drawing Sheets

(56) References Cited

U.S. PATENT DOCUMENTS

| | | | |
|---|---|---|---|
| 2012/0104938 A1* | 5/2012 | Chu | H01L 27/322 313/504 |
| 2012/0258773 A1* | 10/2012 | Alvarez Rivera | G06F 1/1656 455/556.1 |
| 2013/0208201 A1* | 8/2013 | Satoh | G02F 1/1334 349/33 |
| 2013/0250208 A1* | 9/2013 | Wu | H01L 51/52 349/61 |
| 2014/0062839 A1* | 3/2014 | Dominici | B64D 43/00 345/6 |
| 2015/0002769 A1* | 1/2015 | Kalyanasundaram | G02F 1/1334 349/33 |
| 2015/0349028 A1* | 12/2015 | Lee | H01L 27/32 349/86 |
| 2016/0259105 A1* | 9/2016 | Tang | G02B 1/14 |

* cited by examiner

DISPLAY PANEL, DISPLAY APPARATUS HAVING THE SAME AND METHOD FOR DISPLAYING IMAGE USING THE SAME

CLAIM OF PRIORITY

This application claims priority under 35 U.S.C. §119 to Korean patent Application No. 10-2013-0077921, filed on Jul. 3, 2013, the disclosure of which is hereby incorporated by reference herein in its entirety.

BACKGROUND OF THE INVENTION

Field of the Invention

Embodiments of the invention generally relate to a display panel and a display apparatus having the display panel; and more particularly, to a display panel capable of displaying specific colors in a non-display mode and a display apparatus incorporating the display panel.

Description of the Related Art

A display apparatus generally includes a display panel and a receiving container. An image is displayed on the display panel. A bezel of the receiving container, which surrounds the display panel, generally has the color same as a color as the receiving container. The receiving container usually has a black color. Recently, the receiving container may have a chromatic color such as white, red or blue, with the importance of the design being highlighted.

However, the display panel displays black while in a non-display mode, which occurs when the display panel is off. When the bezel of the receiving container has a chromatic color such as white, red or blue but the bezel of the receiving container has a black color, the display panel does not present an overall appearance of design unity due to the color difference between the display panel and the bezel in the non-display mode.

SUMMARY OF THE INVENTION

The exemplary embodiments provide a display panel capable of displaying specific color in a non-display mode.

The exemplary embodiments provide a display apparatus having the display panel.

One or more exemplary embodiments of the invention also provide a method of displaying an image using the display apparatus.

According to one aspect of the exemplary embodiments, a display panel includes a first substrate, a plurality of pixels formed on the first substrate, a first transparent electrode disposed on the first substrate and continuously extending across each pixel, a second transparent electrode disposed opposite to the first transparent electrode and continuously extending across each pixel, and a polymer dispersed liquid crystal layer including photosensitive polymer molecules and liquid crystal molecules, interposed between the first transparent electrode and the second transparent electrode, and continuously extending across each pixel. First and second voltages are respectively applied to the first transparent electrode and the second transparent electrode in a display mode in which an image is displayed via the plurality of pixels.

In the exemplary embodiments, the photosensitive polymer molecules and the liquid crystal molecules of the polymer dispersed liquid crystal layer may be randomly arranged in a non-display mode in which the image is not displayed, so that the polymer dispersed liquid crystal layer may become opaque. The photosensitive polymer molecules of the polymer dispersed liquid crystal layer may be arranged in a transmission axis, and the liquid crystal molecules may be polarized and arranged in order in the display mode, so that the polymer dispersed liquid crystal layer may become transparent.

In the exemplary embodiments, the polymer dispersed liquid crystal layer may have a white color in the non-display mode.

In the exemplary embodiments, the polymer dispersed liquid crystal layer may further include colored dye having a chromatic color.

In the exemplary embodiments, the photosensitive polymer molecules or the liquid crystal molecules of the polymer dispersed liquid crystal layer may include colored dye having a chromatic color.

In the exemplary embodiments, the display panel may further include a first electrode disposed on the first substrate, a light emitting structure disposed on the first electrode and including a light emitting material, and a second electrode disposed on the light emitting structure. The first transparent electrode may be disposed on the second electrode In the exemplary embodiments, the display panel may further include a second substrate disposed on the second transparent electrode.

In the exemplary embodiments, the display panel may further include a second substrate disposed between the second electrode and the first transparent electrode, and a base layer disposed between the second substrate and the first transparent electrode.

In the exemplary embodiments, the display panel may further include an adhesive layer disposed between the second substrate and the base layer.

According to one aspect of the exemplary embodiments, a display apparatus includes a display panel including a plurality of pixels via which an image is displayed, a polymer dispersed liquid crystal film disposed on the display panel, and a receiving container accommodating the display panel and the polymer dispersed liquid crystal film. The polymer dispersed liquid crystal film includes a base layer, a first transparent electrode disposed on the base layer and continuously extending across each pixel, a second transparent electrode disposed opposite to the first transparent electrode and continuously extending across each pixel, a polymer dispersed liquid crystal layer including photosensitive polymer molecules and liquid crystal molecules, interposed between the first transparent electrode and the second transparent electrode, and continuously extending across each pixel, and a top layer disposed on the second transparent electrode. First and second voltages are respectively applied to the first transparent electrode and the second transparent electrode in an image display mode which the image is displayed via the plurality of pixels.

In the exemplary embodiments, the photosensitive polymer molecules and the liquid crystal molecules of the polymer dispersed liquid crystal layer may be randomly arranged in a non-display mode during which the image is not displayed, so that the polymer dispersed liquid crystal layer may become opaque. The photosensitive polymer molecules of the polymer dispersed liquid crystal layer may be arranged in a transmission axis, and the liquid crystal molecules may be polarized and arranged in order in the display mode, so that the polymer dispersed liquid crystal layer may become transparent.

In the exemplary embodiments, the receiving container may have a white color. The polymer dispersed liquid crystal layer may have the white color in the non-display mode.

In the exemplary embodiments, the receiving container may have a first color. The polymer dispersed liquid crystal layer may further include dye having the first color.

In the exemplary embodiments, the receiving container may include a boundary surface in parallel with the display panel and surrounding a boundary of the display panel. The boundary surface may have the first color.

In the exemplary embodiments, the polymer dispersed liquid crystal film may further include an adhesive layer disposed under the base layer and attached on the display panel.

In the exemplary embodiments, the display apparatus may further include a touch panel disposed on the polymer dispersed liquid crystal film.

In the exemplary embodiments, the display panel may include a first substrate, a first electrode disposed on the first substrate, a light emitting structure disposed on the first electrode and including a light emitting material, and a second electrode disposed on the light emitting structure.

In the exemplary embodiments, the photosensitive polymer molecules or the liquid crystal molecules of the polymer dispersed liquid crystal layer may include colored dye having a chromatic color.

According to one aspect of the exemplary embodiments, a display apparatus includes an image display layer displaying the image, a first transparent electrode disposed on the image display layer, a polymer dispersed liquid crystal layer disposed on the first transparent electrode having photosensitive polymer molecules and liquid crystal molecules, and a second transparent electrode disposed on the polymer dispersed liquid crystal layer. A method of displaying an image using the display apparatus includes respectively applying first and second voltages to the first and second transparent electrodes in a display mode which the image is displayed, and blocking the first and second voltages to the first and second transparent electrodes in a non-display mode which the image is not displayed.

In the exemplary embodiments, the photosensitive polymer molecules and the liquid crystal molecules of the polymer dispersed liquid crystal layer may be randomly arranged in a non-display mode which the image is not displayed, so that the polymer dispersed liquid crystal layer may become opaque. The photosensitive polymer molecules of the polymer dispersed liquid crystal layer may be arranged in a transmission axis, and the liquid crystal molecules may be polarized and arranged in order in the display mode, so that the polymer dispersed liquid crystal layer may become transparent.

According to the exemplary embodiments of the invention, the display apparatus includes the polymer dispersed liquid crystal layer which is opaque in the display mode, and is transparent in the non-display area, so that the display apparatus may display a specific chromatic color in the non-display mode.

In addition, the polymer dispersed liquid crystal layer may further include the colored dye according to the color of the receiving container, so that the display area of the display panel and the boundary surface of the receiving container have same color in the non-display area.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
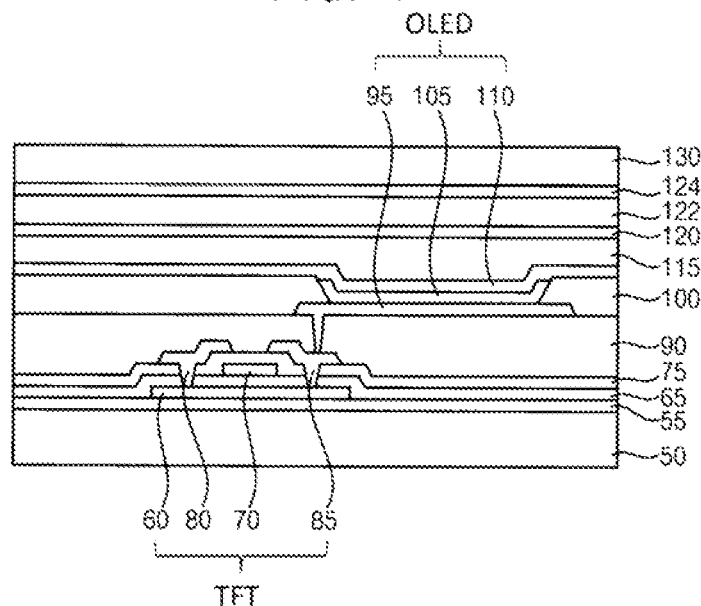
FIG. 1 is a cross-sectional view illustrating a display panel according to an exemplary embodiment of the invention.

The exemplary embodiments are described more fully hereinafter with reference to the accompanying drawings. The principles of the invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular the exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The exemplary embodiments are described herein with reference to cross sectional illustrations that are schematic illustrations of illustratively idealized the exemplary embodiments (and intermediate structures) of the invention. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

FIG. 1 is a cross-sectional view illustrating a display panel constructed as an embodiment according to the principles of the invention.

Referring to FIG. 1, a display panel includes a first substrate 50, a switching device such as a thin film transistor (TFT), and an organic light emitting device (OLED) that includes a first electrode 95, a light emitting structure 105 and a second electrode 110. The display panel further includes a first transparent electrode 120, a polymer dispersed liquid crystal layer 122 and a second transparent electrode 124. Although not shown in FIG. 1, the display panel may include an array of pixels forming in an image display area of the display panel. Each pixel may include a TFT and an OLED. Each of the first transparent electrode 120 and the second transparent electrode 124 may at least continuously extend across the entire display area. The polymer dispersed liquid crystal layer 122 may be interposed between the first transparent electrode 120 and the second transparent electrode 124 and continuously extend across the entire display area.

A buffer layer 55 may be disposed on the first substrate 50. The first substrate 50 may include a transparent insulation substrate. For example, the first substrate 50 may include a glass substrate, a quartz substrate, a transparent resin substrate, etc. Examples of the transparent resin substrate for the first substrate 50 may include polyimide-based resin, acryl-based resin, polyacrylate-based resin, polycarbonate-based resin, polyether-based resin, sulfonic acid containing resin, polyethyleneterephthalate-based resin, etc.

In the exemplary embodiments, the buffer layer 55 may prevent diffusion of metal atoms and/or impurities from the first substrate 50. Additionally, the buffer layer 55 may adjust heat transfer rate of a successive crystallization process for an active layer 60, thereby obtaining a substantially uniform active layer 60. In case that the first substrate 50 may have a relatively irregular surface, the buffer layer 55 may improve flatness of the surface of the first substrate 50. The buffer layer 55 may be formed using a silicon compound. For example, the buffer layer 55 may include silicon oxide (SiOx), silicon nitride (SiNx), silicon oxynitride (SiOxNy), silicon oxycarbide (SiOxCy), silicon carbon nitride (SiCxNy), etc. These may be used alone or in a mixture thereof. The buffer layer 55 may be applied on the first substrate 50 by a spin coating process, a chemical vapor deposition (CVD) process, a plasma enhanced chemical vapor deposition (PECVD) process, a high density plasma-chemical vapor deposition (HDP-CVD) process, a printing process, etc. The buffer layer 55 may have a single layer structure or a multi-layer structure. For example, the buffer layer 55 may have a single-layered structure including a silicon oxide film, a silicon nitride film, a silicon oxynitride film, a silicon oxycarbide film or a silicon carbon nitride film. Alternatively, the buffer layer 55 may have a multilayered structure including at least two of a silicon oxide film, a silicon nitride film, a silicon oxynitride film, a silicon oxycarbide film, a silicon carbon nitride film, etc. In some the exemplary embodiments, the buffer layer 55 may not be formed on the first substrate 50 in accordance with materials and/or surface conditions of the first substrate 50.

The switching device may be provided on the buffer layer 55. In the exemplary embodiments, the switching device may include a thin film transistor (TFT) having the active layer 60 that may contain silicon (Si). Here, the switching device may include the active layer 60, a gate insulation layer 65, a gate electrode 70, a source electrode 80, a drain electrode 85, etc. In some the exemplary embodiments, the switching device may include an oxide semiconductor device having an active layer that may contain semiconductor oxides.

When the switching device includes the TFT, the active layer may be disposed on the buffer layer 55. The active layer 60 may have a source region and a drain region both of which are doped with impurities. The active layer 60 may additionally include a channel region provided between the source region and the drain region.

In the exemplary embodiments, a semiconductor layer (not illustrated) may be formed on the buffer layer 55, and then a preliminary active layer (not illustrated) may be formed on the buffer layer 55 by patterning the semiconductor layer. The crystallization process may be performed about the preliminary active layer to form the active layer 60 on the buffer layer 55. Here, the semiconductor layer may be formed by a CVD process, a PECVD process, a low pressure chemical vapor deposition (LPCVD) process, a sputtering process, a printing process, etc. When the semiconductor layer includes amorphous silicon, the active layer 60 may include polysilicon. The crystallization process for forming the active layer 60 may include a laser irradiation process, a thermal treatment process, a thermal process utilizing a catalyst, etc.

In some the exemplary embodiments, a dehydrogenation process may be performed about the semiconductor layer and/or the preliminary active layer after forming the semiconductor layer and/or the preliminary active layer on the buffer layer 55. The dehydrogenation process may reduce the hydrogen concentration of the semiconductor layer and/or the preliminary active layer, so that the active layer 60 may have improved electrical characteristics.

The gate insulation layer 65 may be disposed on the buffer layer 55 to cover the active layer 60. The gate insulation layer 65 may be formed by a CVD process, a spin coating process, a PECVD process, a sputtering process, a vacuum evaporation process, an HDP-CVD process, a printing process, etc. The gate insulation layer 65 may include silicon oxide, metal oxide, etc. Examples of metal oxide in the gate insulation layer 65 may include hafnium oxide (HfOx), aluminum oxide (AlOx), zirconium oxide (ZrOx), titanium oxide (TiOx), tantalum oxide (TaOx), etc. These may be used alone or in a combination thereof. In the exemplary embodiments, the gate insulation layer 65 may be uniformly formed on the buffer layer 55 along a profile of the active layer 60. Here, the gate insulation layer 65 may have a substantially small thickness, such that a stepped portion may be generated at a portion of the gate insulation layer 65 adjacent to the active layer 60. In some the exemplary embodiments, the gate insulation layer 65 may have a relatively large thickness for sufficiently covering the active layer 60, so that the gate insulation layer 65 may have a substantially level surface.

The gate electrode 70 may be located on the gate insulation layer 65. For example, the gate electrode 70 may be positioned on a portion of the gate insulation layer 65 under which the active layer 60 is located. In the exemplary embodiments, a first conductive layer (not illustrated) may be formed on the gate insulation layer 65, and then the first conductive layer may be partially etched by a photolithography process or an etching process using an additional etching mask. Hence, the gate electrode 70 may be provided on the gate insulation layer 65. The first conductive layer may be formed by a printing process, a sputtering process, a CVD process, a pulsed laser deposition (PLD) process, a vacuum evaporation process, an atomic layer deposition (ALD) process, etc. The gate electrode 70 may include metal, alloy, conductive metal oxide, a transparent conductive material, etc. For example, the gate electrode 70 may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. In the exemplary embodiments, the gate electrode 70 may have a single layer structure or a multi-layer structure, which may include a metal film, an alloy film, a metal nitride film, a conductive metal oxide film and/or a transparent conductive film.

Although it is not illustrated, a gate line may be formed on the gate insulation layer 65 while forming the gate electrode 70 on the gate insulation layer 65. The gate electrode 70 may make contact with the gate line, and the gate line may extend on the gate insulation layer 65 along a first direction.

An insulating interlayer 75 may be disposed on the gate insulation layer 65 to cover the gate electrode 70. The insulating interlayer 75 may electrically insulate the source and the drain electrodes 80 and 85 from the gate electrode 70. The insulating interlayer 75 having a substantially uniform thickness may be conformally formed on the gate insulation layer 65 along a profile of the gate electrode 70. Thus, a stepped portion may be generated at a portion of the insulating interlayer 75 adjacent to the gate electrode 70. The insulating interlayer 75 may be formed using a silicon compound. For example, the insulating interlayer 75 may include silicon oxide, silicon nitride, silicon oxynitride, silicon oxycarbide and/or silicon carbon nitride. These may be used alone or in a mixture thereof. The insulating interlayer 75 may be obtained by a spin coating process, a CVD process, a PECVD process, an HDP-CVD process, an LPCVD process, etc. In the exemplary embodiments, the insulating interlayer 75 may have a single layer structure or a multi layer structure, which may include a silicon oxide film, a silicon nitride film, a silicon oxynitride film, a silicon oxycarbide film and/or a silicon carbon nitride film.

As illustrated in FIG. 1, the source electrode 80 and the drain electrode 85 may be disposed on the insulating interlayer 75. The source and the drain electrodes 80 and 85 may be separated each other by a predetermined distance substantially centering the gate electrode 75. The source and the drain electrodes 80 and 85 may pass through the insulating interlayer 75, and may contact the source and the drain regions of the active layer 60, respectively. In the exemplary embodiments, the insulating interlayer 75 may be partially etched to form contact holes exposing the source and the drain regions, respectively. Then, a second conductive layer (not illustrated) may be formed on the insulating interlayer 75 to fill the contact holes. The second conductive layer may be removed until the insulating interlayer 75 is exposed, so that the source and the drain electrodes 80 and 85 may be formed on the source and the drain regions, respectively. The second conductive layer may be obtained by a sputtering process, a CVD process, a PLD process, a vacuum evaporation process, an ALD process, a printing process, etc. Each of the source and the drain electrodes 80 and 85 may include metal, alloy, metal nitride, conductive metal oxide, a transparent conductive material, etc. For example, the source and the drain electrodes 80 and 85 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In the exemplary embodiments, each of the source and the drain electrodes 80 and 85 may have a single layer structure or a multi layer structure, which may include a metal film, an alloy film, a metal nitride film, a conductive metal oxide film and/or a transparent conductive film.

Although it is not illustrated in FIG. 1, a data line may be formed on the insulating interlayer 75 while forming the source and the drain electrodes 80 and 85. The data line may extend on the insulating interlayer 75 along a second direction. In this case, the second direction of the date line may be substantially perpendicular to the first direction of the gate line.

As formation of the source and the drain electrodes 80 and 85 on the insulating interlayer 75, the switching device may be provided on the first substrate 50. The switching device may include the TFT that may have the active layer 60, the gate insulation layer 65, the gate electrode 75, the source electrode 80 and the drain electrode 85.

An insulation layer 90 may be disposed on the insulating interlayer 75. The insulation layer 90 may have a single-layered structure or a multi-layered structure including at least two insulation films. In the exemplary embodiments, a planarization process may be executed on the insulation layer 90 to enhance the flatness of the insulation layer 90. For example, the insulation layer 90 may have a substantially level surface by a chemical mechanical polishing (CMP) process, an etch-back process, etc. The insulation layer 90 may be formed using an organic material. For example, the insulation layer 90 may include photoresist, acryl-based resin, polyimide-based resin, polyamide-based resin, siloxane-based resin, etc. These may be used alone or in a combination thereof. Alternatively, the insulation layer 90 may include an inorganic material. For example, the insulation layer 90 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in a mixture thereof. The insulation layer 90 may be obtained by a spin coating process, a printing process, a sputtering process, a CVD process, an ALD process, a PECVD process, an HDP-CVD process or a vacuum evaporation process in accordance with ingredients included in the insulation layer 90.

The insulation layer 90 may be partially etched by a photolithography process or an etching process using an additional etching mask such as a hard mask, so that a contact hole may be formed through the insulation layer 90. The contact hole may partially expose the drain electrode 85 of the switching device. In the exemplary embodiments, the contact hole may have a sidewall inclined by a predetermined angle relative to the first substrate 50. For example, the contact hole may have an upper width substantially larger than a lower width thereof.

The first electrode 95 may be disposed on the insulation layer 90 to fill the contact hole formed through the insulation layer 90. Thus, the first electrode 95 may make contact with the drain electrode 85 exposed by the contact hole. In some the exemplary embodiments, a contact, a plug or a pad may be formed in the contact hole, and then the first electrode 95 may be formed on the contact, the plug or the pad. Here, the first electrode 95 may be electrically connected to the drain electrode 85 through the contact, the plug or the pad.

The first electrode 95 may include a reflective material or a transmissive material in accordance with the emission type of the display device having the display panel 10 and the touch panel. For example, the first electrode 95 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. The first electrode 95 may be obtained by a printing process, a sputtering process, a CVD process, an ALD process, a vacuum evaporation process, a PLD process, etc. In the exemplary embodiments, the first electrode 95 may have a single layer structure or a multi layer structure, which may include a metal film, an alloy film, a metal nitride film, a conductive metal oxide film and/or a transparent conductive film.

A pixel defining layer 100 may be disposed on the first electrode 95 and the insulation layer 90. The pixel defining layer 100 may include an organic material or an inorganic material. For example, the pixel defining layer 100 may be formed using photoresist, acryl-based resin, polyacryl-based resin, polyimide-based resin, a silicon compound, etc. The pixel defining layer 100 may be obtained by a spin coating process, a spray process, a printing process, a CVD process, a PECVD process, an HDP-CVD process, etc. In the exemplary embodiments, the pixel defining layer 100 may be partially etched to form an opening partially exposing the first electrode 95. The opening of the pixel defining layer 100 may define a luminescent region and a non-luminescent region of the display panel 10. For example, a portion of the display panel 10 having the opening of the pixel defining layer 100 may be the luminescent region of the display device while another portion of the display panel 10 around the opening of the pixel defining layer 100 may be the non-luminescent region of the display device.

The light emitting structure 105 may be positioned on the first electrode 95 exposed by the opening of the pixel defining layer 100. The light emitting structure 105 may extend on a sidewall of the opening of the pixel defining layer 100. The light emitting structure 105 may be formed by a laser induced thermal imaging process, a printing process, etc. The light emitting structure 105 may include an organic light emitting layer (EL), a hole injection layer (HIL), a hole transfer layer (HTL), an electron transfer layer (ETL), an electron injection layer (EIL), etc. In the exemplary embodiments, a plurality of organic light emitting layers may be formed using light emitting materials for generating different colors of light such as a red color of light (R), a green color of light (G) and a blue color of light (B) in accordance with color pixels of the display device. In some the exemplary embodiments, the organic light emitting layer of the of the light emitting structure 105 may include a plurality of stacked light emitting materials for generating a red color of light, a green color of light and a blue color of light to thereby emitting a white color of light.

The second electrode 110 may be disposed on the light emitting structure 105 and the pixel defining layer 100. The second electrode 100 may include a transmissive material or a reflective material in accordance with the emission type of the display device. For example, the second electrode 110 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. Additionally, the second electrode 110 may be formed by a printing process, a sputtering process, a CVD process, an ALD process, a vacuum evaporation process, a PLD process, etc. In the exemplary embodiments, the second electrode 110 may also have a single layer structure or a multi layer structure, which may include a metal film, an alloy film, a metal nitride film, a conductive metal oxide film and/or a transparent conductive film.

A protecting player 115 may be displayed on the second layer 110. The protecting player 115 may include a resin, for example, photoresist, acryl-based resin, polyimide-based resin, polyamide-based resin, siloxane-based resin, etc. These may be used or in a combination thereof.

The first transparent electrode 120 is disposed on the protecting player 115. The first transparent electrode 120 may include a transparent conductive material, such as indium tin oxide (ITO), indium zinc oxide (IZO) and etc. In addition, the first transparent electrode 120 may further include titanium (Ti) or molybdenum-titanium alloy (MoTi).

The polymer dispersed liquid crystal layer 122 is disposed on the first transparent electrode 120. The polymer dispersed liquid crystal layer 122 includes liquid crystal molecules and photosensitive polymer molecules.

The second transparent electrode 130 is disposed on the polymer dispersed liquid crystal layer 122. The second transparent electrode 130 may include a transparent conductive material, such as indium tin oxide (ITO), indium zinc oxide (IZO) and etc. In addition, the second transparent electrode 130 may further include titanium (Ti) or molybdenum-titanium alloy (MoTi).

When the polymer dispersed liquid crystal layer 122 is irradiated by ultraviolet ray, the photosensitive polymer molecules may be hardened, so that a plurality of gas pocket having a liquid crystal molecule in itself is formed in the polymer dispersed liquid crystal layer 122. When first and second voltages are not applied to the first and second transparent electrodes 120 and 130, the photosensitive polymer molecules which surrounding a liquid crystal molecule and the liquid crystal molecules are randomly arranged, so that the polymer dispersed liquid crystal layer 122 blocks and diffuse light. Thus, the polymer dispersed liquid crystal layer 122 becomes opaque. In this case, the polymer dispersed liquid crystal layer 122 normally has a white status. However, when first and second voltages are applied to the first and second transparent electrodes 120 and 130, the liquid crystal molecules may be polarized and arranged in order, and the photosensitive polymer molecules may be arranged in a transmission axis, so that light passes the polymer dispersed liquid crystal layer 122. Thus, the polymer dispersed liquid crystal layer 122 becomes transparent.

The polymer dispersed liquid crystal layer 122 may further include colored dye. The colored dye gives a specific color to the polymer dispersed liquid crystal layer 122 when the polymer dispersed liquid crystal layer 122 is opaque. For example, the colored dye may have red, blue, pink and etc. In this case, the colored dye may have a color substantially same as that of a receiving container of a display apparatus including the display panel. Thus, when the display panel is off, the display panel and the receiving container have same color, so that design of the display apparatus may be improved.

In addition, although the polymer dispersed liquid crystal layer 122 includes the colored dye in the present example embodiment, the colored dye may be included in the photosensitive polymer molecules and/or in the liquid crystal molecules.

The second substrate 130 may be disposed on a second transparent electrode 124. The second substrate 130 may include a transparent insulation substrate. For example, the second substrate 130 may include a glass substrate, a quartz substrate, a transparent resin substrate, etc.

In a display mode which the display panel displays an image, first and second voltages are applied to the first and second transparent electrodes 120 and 130, so that the polymer dispersed liquid crystal layer 122 is transparent. Thus, a user may see the image which the display panel displays.

In addition, in a non-display mode which the display panel does not display the image, first and second voltages are not applied to the first and second transparent electrode 120 and 130, so that the polymer dispersed liquid crystal layer 122 is opaque. Thus, the user may see a specific color, which the polymer dispersed liquid crystal layer 122 has.

Figure 2:
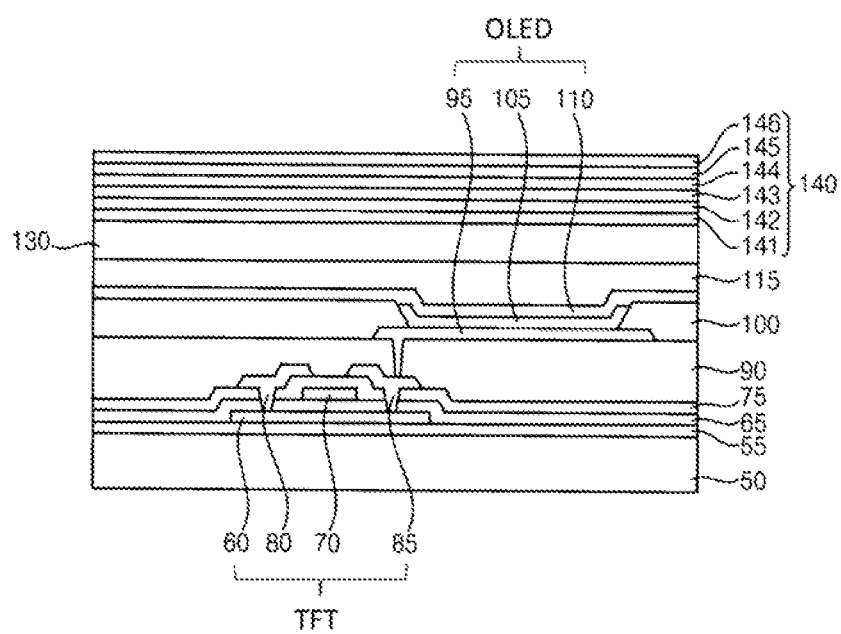
FIG. 2 is a cross-sectional view illustrating a display panel according to another exemplary embodiment of the invention.

FIG. 2 is a cross-sectional view illustrating a display panel constructed as another embodiment according to the principles of the invention.

Referring to FIG. 2, a display panel is substantially same as a display panel of FIG. 1, except for a polymer dispersed liquid crystal film 140. Thus, any further detailed descriptions concerning the same elements will be omitted.

The display panel includes a first substrate 50, a switching device, a first electrode 95, a light emitting structure 105, a second electrode 110 and a second substrate 120. The display panel includes the polymer dispersed liquid crystal film 140 disposed on the second substrate 120.

The polymer dispersed liquid crystal film 140 includes a base layer 142, a first transparent electrode 143, a polymer dispersed liquid crystal layer 144, a second transparent electrode 145, and a top layer 146. The polymer dispersed liquid crystal film 140 may further include an adhesive layer 141.

A base layer 142 may be a polyester film, a polycarbonate film, a polymethylmethacrylate film, and a polyethylene naphthalate film.

The first transparent electrode 143 may include a transparent conductive material, such as indium tin oxide (ITO), indium zinc oxide (IZO) and etc. In addition, the first transparent electrode 143 may further include titanium (Ti) or molybdenum-titanium alloy (MoTi).

The polymer dispersed liquid crystal layer 144 is disposed on the first transparent electrode 143. The polymer dispersed liquid crystal layer 144 includes liquid crystal molecules and photosensitive polymer molecules. The polymer dispersed liquid crystal layer 122 may further include colored dye.

The second transparent electrode 145 is disposed on the polymer dispersed liquid crystal layer 144. The second transparent electrode 145 may include a transparent conductive material, such as indium tin oxide (ITO), indium zinc oxide (IZO) and etc. In addition, the second transparent electrode 145 may further include titanium (Ti) or molybdenum-titanium alloy (MoTi).

The adhesive layer 141 is disposed between the second substrate 130 and the base layer 142, and bonds the polymer dispersed liquid crystal film 140 to the second substrate 130. The adhesive layer 141 may include a silicone adhesive, an acrylic adhesive, an epoxy adhesive, a urethane adhesive, etc. The polymer dispersed liquid crystal film 140 having the adhesive layer 141 is formed, and then the display panel is completed by attaching the polymer dispersed liquid crystal film 140 on the second substrate 130.

Figure 3:
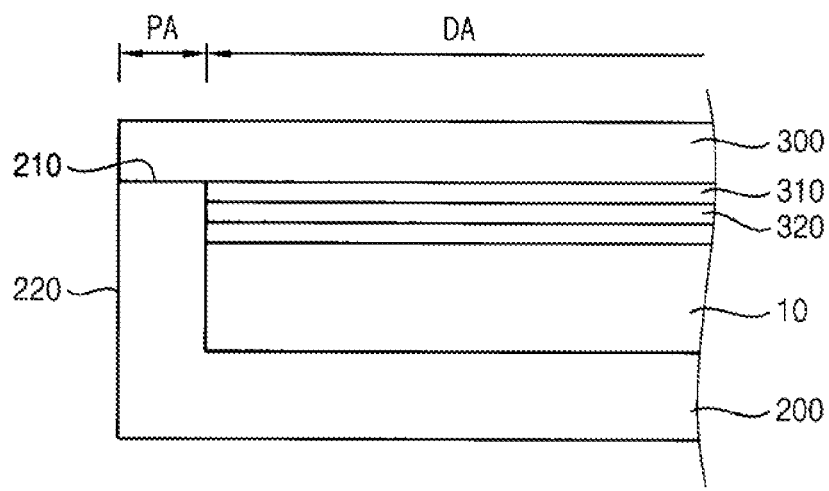
FIG. 3 is a cross-sectional view illustrating a display apparatus according to an exemplary embodiment of the invention.

FIG. 3 is a cross-sectional view illustrating a display apparatus constructed as an embodiment according to the principles of the present invention.

Referring to FIG. 3, a display apparatus includes a display panel 10, a receiving container 200 and a protecting cover 300. The display apparatus may further include a touch panel 310 which senses user's touch and a polarizing film 320. The display panel 10 is substantially same as a display panel of FIG. 1 or 2.

The receiving container 200 receives the display panel 10. The receiving container 200 has an outer surface 220 and a boundary surface 210. The boundary surface 210 corresponds to a peripheral area PA which is seen to a user when the user sees a display area DA of the display panel 10. The boundary surface 210 may have a color same as the outer surface 220, and have a black color or a chromatic color. For example, the boundary surface 210 may have white, red, blue, pink and etc.

The display panel 10 includes a polymer dispersed liquid crystal layer (refers to 122 of FIG. 1 or 144 of FIG. 2). The polymer dispersed liquid crystal layer may further include colored dye. The colored dye may give the polymer dispersed liquid crystal layer a color same as that of the boundary surface 210 when the polymer dispersed liquid crystal layer is opaque. For example, the colored dye may have red, blue, pink and etc. In addition, although the polymer dispersed liquid crystal layer does not include the colored dye, the polymer dispersed liquid crystal layer may have a white color same as the boundary surface 210 when the boundary surface 210 has the white color. Thus, when the display panel is off, the display panel and the receiving container have same color, so that design of the display apparatus may be improved.

The protecting cover 300 protects the display panel 10, the touch panel 310, and the polarizing film 320. For example, the protecting cover 300 may be a transparent tempered glass.

Figure 4:
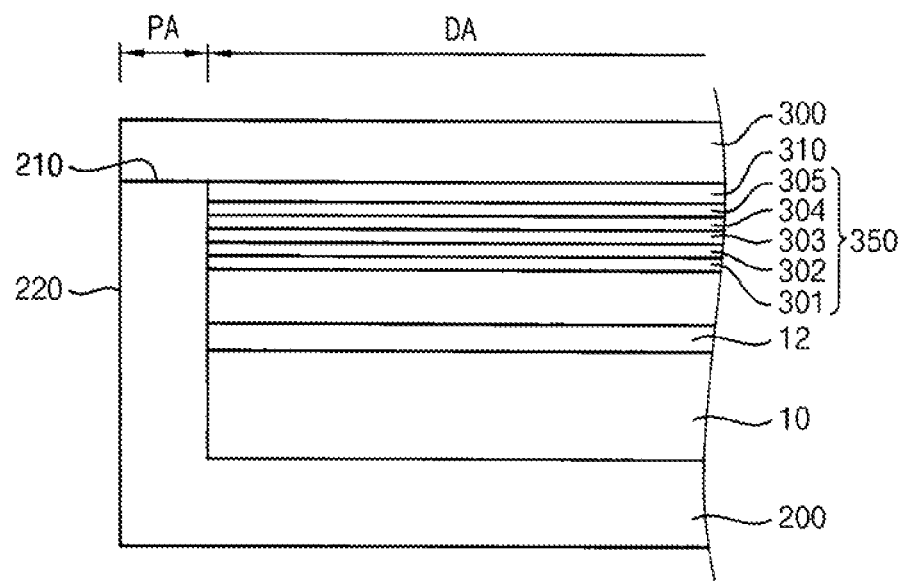
FIG. 4 is a cross-sectional view illustrating a display apparatus according to another exemplary embodiment of the invention.

FIG. 4 is a cross-sectional view illustrating a display apparatus constructed as another embodiment according to the principles of the present invention.

Referring to FIG. 4, a display apparatus is substantially same as a display apparatus of FIG. 3, except for a polymer dispersed liquid crystal film 350. Thus, any further detailed descriptions concerning the same elements will be omitted.

The display apparatus includes a display panel 10, a receiving container 200, the polymer dispersed liquid crystal film 350, and a protecting cover 300. The display apparatus may further include a touch panel 310 disposed between the polymer dispersed liquid crystal film 350 and the protecting cover 300, and a polarizing film 12 disposed on the display panel 10.

The polymer dispersed liquid crystal film 350 includes a base layer 301, a first transparent electrode 302, a polymer dispersed liquid crystal layer 303, a second transparent electrode 304, and a top layer 305. The polymer dispersed liquid crystal film 350 is substantially same as a polymer dispersed liquid crystal film 140 of FIG. 2. Thus, any further detailed descriptions concerning the same elements will be omitted.

The polymer dispersed liquid crystal layer 303 may further include colored dye. The colored dye may give the polymer dispersed liquid crystal layer 303 a color same as that of a boundary surface 210 when the polymer dispersed liquid crystal layer 303 is opaque. For example, the colored dye may have red, blue, pink, etc. In addition, although the polymer dispersed liquid crystal layer 303 does not include the colored dye, the polymer dispersed liquid crystal layer may have a white color same as the boundary surface 210 when the boundary surface 210 has the white color. Thus, when the display panel 10 is off, the display panel 10 and the receiving container 200 have same color, so that design of the display apparatus may be improved.

The display apparatus may be completed by adding the polymer dispersed liquid crystal film 350 having the polymer dispersed liquid crystal layer 303 and a driving part (not shown) driving the polymer dispersed liquid crystal layer 303 to a traditional display apparatus. The driving part applies first and second voltages to the first transparent electrode 302 and the second transparent electrode 304 in a display mode which the display panel displays an image. In addition, the driving part does not apply the first and second voltages to the first transparent electrode 302 and the second transparent electrode 304 in a non-display mode which the display panel does not display an image.

Figure 5:
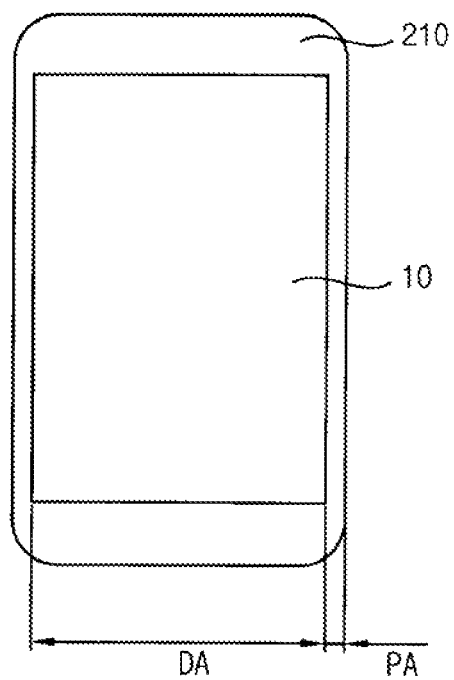
FIG. 5 is a plan view of a display apparatus according to an exemplary embodiment of the invention to explain relationship between color of a display area and color of a peripheral area.

FIG. 5 is a plan view of a display apparatus constructed as an embodiment according to the principles of the present invention to explain relationship between color of a display area and color of a peripheral area.

Referring to FIG. 5, in a plan view, the display panel is divided into a display area DA on which an image is disposed and a peripheral area PA surrounding the display area DA. A display panel 10 is disposed corresponding to the display area DA, a boundary surface 210 of the receiving container (refers to 200 of FIG. 3) is disposed corresponding to the peripheral area PA.

The boundary surface 210 may have a color same as a color of an outer surface of the receiving container. The boundary surface 210 may have black color or a chromatic color. For example, the boundary surface 210 may have white, red, blue, pink and etc.

The display panel 10 includes a polymer dispersed liquid crystal layer (refers to 122 of FIG. 1 or 144 of FIG. 2). The polymer dispersed liquid crystal layer may further include colored dye. The colored dye may give the polymer dispersed liquid crystal layer a color same as that of the boundary surface 210 when the polymer dispersed liquid crystal layer is opaque. For example, the colored dye may have red, blue, pink and etc. In addition, although the polymer dispersed liquid crystal layer does not include the colored dye, the polymer dispersed liquid crystal layer may have a white color same as the boundary surface 210 when the boundary surface 210 has the white color. Thus, when the display panel is off, the display panel and the receiving container have same color, so that design of the display apparatus may be improved.

According to the exemplary embodiments of the invention, the display apparatus includes the polymer dispersed liquid crystal layer which is opaque in the display mode, and is transparent in the non-display area, so that the display apparatus may display a specific chromatic color in the non-display mode.

In addition, the polymer dispersed liquid crystal layer may further include the colored dye according to the color of the receiving container, so that the display area of the display panel and the boundary surface of the receiving container have same color in the non-display area.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed:

1. A display apparatus, comprising:
   a container;

a display panel disposed in the container, the display panel comprising, in order:
a first substrate;
a plurality of pixels formed on the first substrate, the plurality of pixels forming a display area;
a protection layer disposed on the plurality of pixels;
a first transparent electrode disposed on the protection layer and extending continuously across the display area;
a polymer dispersed liquid crystal layer including photosensitive polymer molecules and liquid crystal molecules, disposed on the first transparent electrode, and extending continuously across the display area; and
a second transparent electrode disposed on the polymer dispersed liquid crystal layer and extending continuously across the display area, wherein
a variable image, displayed during a display mode of the plurality of pixels, is transmitted through the polymer dispersed liquid crystal layer only in response to first and second voltages applied respectively to the first transparent electrode and the second transparent electrode.

2. The display panel of the claim 1, wherein:
the photosensitive polymer molecules and the liquid crystal molecules of the polymer dispersed liquid crystal layer are randomly arranged in a non-display mode during which the image is not displayed, so that the polymer dispersed liquid crystal layer becomes opaque, and
the photosensitive polymer molecules of the polymer dispersed liquid crystal layer are arranged in a transmission axis, and the liquid crystal molecules are polarized and arranged in order in the display mode, so that the polymer dispersed liquid crystal layer becomes transparent.

3. The display panel of the claim 2, wherein the polymer dispersed liquid crystal layer further comprises a colored dye having a chromatic color.

4. The display panel of the claim 2, wherein the polymer dispersed liquid crystal layer has a white color in the non-display mode.

5. The display panel of the claim 4, wherein the photosensitive polymer molecules or the liquid crystal molecules of the polymer dispersed liquid crystal layer comprises a colored dye having a chromatic color.

6. The display panel of the claim 1, wherein each pixel comprises:
a first electrode disposed on the first substrate;
a light emitting structure disposed on the first electrode and comprising a light emitting material; and
a second electrode disposed on the light emitting structure.

7. The display panel of the claim 6, further comprising a second substrate disposed on the protective layer.

8. The display panel of the claim 6, further comprising a second substrate disposed on the protective layer, and a base layer disposed between the second substrate and the first transparent electrode.

9. The display panel of the claim 8, further comprising an adhesive layer disposed between the second substrate and the base layer.

10. A display apparatus, comprising:
a display panel including a plurality of pixels via which a variable image is displayed;
a polymer dispersed liquid crystal film disposed on the display panel, the polymer dispersed liquid crystal film comprising:
a base layer;
a first transparent electrode disposed on the base layer and extending continuously across each pixel of the plurality of pixels;
a second transparent electrode disposed opposite to the first transparent electrode and extending continuously across each pixel of the plurality of pixels;
a polymer dispersed liquid crystal layer including photosensitive polymer molecules and liquid crystal molecules, interposed between the first transparent electrode and the second transparent electrode, and continuously extending across each pixel, first and second voltages being respectively applied to the first transparent electrode and the second transparent electrode during the display mode such that the variable image is visable through the polymer dispersed liquid crystal film; and
a top layer disposed on the second transparent electrode; and
a receiving container accommodating the display panel and the polymer dispersed liquid crystal film.

11. The display apparatus of the claim 10, wherein:
the photosensitive polymer molecules and the liquid crystal molecules of the polymer dispersed liquid crystal layer are randomly arranged in a non-display mode during which the image is not displayed, so that the polymer dispersed liquid crystal layer becomes opaque, and
the photosensitive polymer molecules of the polymer dispersed liquid crystal layer are arranged in a transmission axis, and the liquid crystal molecules are polarized and arranged in order during the display mode, so that the polymer dispersed liquid crystal layer becomes transparent.

12. The display apparatus of the claim 11, wherein the receiving container has a white color, and the polymer dispersed liquid crystal layer has the white color in the non-display mode.

13. The display apparatus of the claim 11, wherein the receiving container has a first color, and the polymer dispersed liquid crystal layer further comprises dye having the first color.

14. The display apparatus of the claim 13, wherein:
the receiving container comprises a boundary surface in parallel with the display panel and surrounding a boundary of the display panel, and
the boundary surface has the first color.

15. The display apparatus of the claim 11, wherein the display panel comprises a first substrate and each pixel comprises:
a first electrode disposed on the first substrate;
a light emitting structure disposed on the first electrode and comprising a light emitting material; and
a second electrode disposed on the light emitting structure.

16. The display apparatus of the claim 11, wherein the photosensitive polymer molecules or the liquid crystal molecules of the polymer dispersed liquid crystal layer comprises colored dye having a chromatic color.

17. The display apparatus of the claim 10, wherein the polymer dispersed liquid crystal film further comprises an adhesive layer disposed under the base layer and attached on the display panel.

18. The display apparatus of the claim 17, further comprising a touch panel disposed on the polymer dispersed liquid crystal film.

* * * * *